United States Patent
Johnson (10) Patent No.: US 6,858,519 B2
(45) Date of Patent: Feb. 22, 2005

(54) ATOMIC HYDROGEN AS A SURFACTANT IN PRODUCTION OF HIGHLY STRAINED INGAAS, INGAASN, INGAASNSB, AND/OR GAASNSB QUANTUM WELLS

(75) Inventor: Ralph H. Johnson, Murphy, TX (US)

(73) Assignee: Finisar Corporation, Sunnyvale, CA (US)

(*) Notice: Subject to any disclaimer, the term of this patent is extended or adjusted under 35 U.S.C. 154(b) by 2 days.

(21) Appl. No.: 10/219,425

(22) Filed: Aug. 14, 2002

(65) Prior Publication Data

US 2004/0033637 A1 Feb. 19, 2004

(51) Int. Cl.[7] .......................... H01L 21/20; H01L 21/36
(52) U.S. Cl. .......................... 438/507; 438/29; 438/962
(58) Field of Search .................... 117/89, 102; 438/29, 438/32, 47, 503, 507, 962

(56) References Cited

U.S. PATENT DOCUMENTS

| | | | |
|---|---|---|---|
| 5,251,225 A | | 10/1993 | Eglash et al. |
| 5,383,211 A | | 1/1995 | Van de Walle et al. |
| 5,547,898 A | * | 8/1996 | Grodzinski et al. ............ 117/89 |
| 5,557,627 A | | 9/1996 | Schneider, Jr. et al. |
| 5,583,351 A | | 12/1996 | Brown et al. |
| 5,719,893 A | | 2/1998 | Jiang et al. |
| 5,745,515 A | | 4/1998 | Marta et al. |
| 5,757,833 A | | 5/1998 | Arakawa et al. |
| 6,252,894 B1 | | 6/2001 | Sasanuma et al. |
| 6,359,920 B1 | | 3/2002 | Jewell et al. |
| 6,363,092 B1 | | 3/2002 | Botez et al. |
| 6,489,175 B1 | * | 12/2002 | Lee et al. ..................... 438/29 |
| 2002/0075920 A1 | | 6/2002 | Spruytte et al. |

OTHER PUBLICATIONS

Goh et al., "Arsenic Incorporation in InAlGa Grown by MBE at Low temperatures Under Atomic Hydrogen Irradiation", Proceedings of Conference on Optoelectronic and Microelectronic Materials and Devices, p 102–105, Dec 14–16 1998, Perth, WA, Australia, Sponsored by IEEE.*

M. de Keijser, "Atomic layer Epitaxy of Gallium Arsenide With the Use of Atomic Hydrogen," Appl. Phys. Lett., vol. 58 (11), p 1187–1189 (1991).*

Yamada, M., et al., "Room temperature low threshold CW operation of 1.23 μm GaAsSb VCSELs on GaAs substrates," Electronic Letters, vol. 36, No. 7, pp. 637–638, Mar. 30, 2000.

Yang, X., et al., InGaAsNSb/GaAs quantum wells for 1.55 μm lasers grown by molecular–beam epitaxy, Applied Physics Letters, vol. 78, No. 26, pp. 4068–4070, Jun. 2001.

* cited by examiner

Primary Examiner—Asok Kumar Sarkar
(74) Attorney, Agent, or Firm—Workman Nydegger (57) ABSTRACT

Atomic hydrogen flux impinging on the surface of a growing layer of III–V compounds during VCSEL processing can prevent three-dimensional growth and related misfit dislocations. Use of hydrogen during semiconductor processing can allow, for example, more indium in InGaAs quantum wells grown on GaAs. Atomic hydrogen use can also promote good quality growth at lower temperatures, which makes nitrogen incorporated in a non-segregated fashion producing better material. Quantum wells and associated barriers layers can be grown to include nitrogen (N), aluminum (Al), antimony (Sb), and/or indium (In) placed within or about a typical GaAs substrate to achieve long wavelength VCSEL performance, e.g., within the 1260 to 1650 nm range.

20 Claims, 4 Drawing Sheets

ATOMIC HYDROGEN AS A SURFACTANT IN PRODUCTION OF HIGHLY STRAINED INGAAS, INGAASN, INGAASNSB, AND/OR GAASNSB QUANTUM WELLS

TECHNICAL FIELD

This invention relates to vertical cavity surface emitting lasers (VCSEL) and more particularly to VCSELs utilizing combinations of nitrogen (N), aluminum (Al), antimony (Sb), phosphorous (P) and/or indium (In) as a material system and as a means to increase VCSEL device wavelength. More particularly the present invention relates to a VCSEL including atomic hydrogen as a surfactant during molecular beam epitaxy (MBE) processing of InGaAs, InGaAsN, InGaAsNSb and/or GaAsNSb quantum wells.

BACKGROUND OF THE INVENTION

Solid-state semiconductor lasers are important devices in applications, such as in optoelectronic communication systems and in high-speed printing systems. Recently, there has been an increased interest in vertical cavity surface emitting lasers (VCSELs), although edge-emitting lasers are currently utilized in the vast majority of applications. A reason for this interest in VCSELs is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each laser device. On the other hand, not only does the beam of a VCSEL have a small angular divergence, a VCSEL emits light normal to the surface of the wafer. In addition, because VCSELs incorporate the mirrors monolithically in their design, they allow for on-wafer testing and the fabrication of one-dimensional or two-dimensional laser arrays.

VCSELs are typically made by growing several layers on a substrate material. Typically, VCSELs include a first mirrored stack, formed on the substrate by semiconductor manufacturing techniques, an active region, formed on top of the first mirrored stack, and a second mirrored stack formed on top of the active region. By providing a first contact on top of the second mirrored stack, and a second contact on the backside of the substrate, a current is forced through the active region, thus driving the VCSEL.

The active region is comprised of one or more quantum wells sandwiched between two spacer cladding regions. Inside the spacers, the active region is sandwiched by confining layers. The confining layers or regions are used to provide electrical confinement of minority carriers. By selecting the appropriate materials for the quantum well, the confining layers, and the barrier layers, a VCSEL generally may be grown or fabricated that generates light at a desirable, predetermined wavelength. For example, by using InGaAs quantum wells on GaAs substrates, longer wavelength VCSELs (e.g., 1310-nm, 1550-nm) can be produced. The use of InGaAs quantum wells, however, causes strain in the quantum wells. If the quantum wells are grown past their critical thickness, then they relax by creating dislocations, and thus a poor quality active region.

The thickness of the various layers in the active region, while not arbitrary, has some flexibility within the constraints of the design and the process. The combined thickness of the spacers, the confining layers, the barriers and the active regions sandwiched by the mirrors are generally configured such that a Fabrey Perot resonator is formed thereby. The quantum wells should be positioned so that they are roughly centered at an antinode of the electric field. These two requirements define the spacer thickness in terms of the other layer thicknesses. The barrier layer thicknesses between the quantum wells need to be thick enough to adequately define the quantum wells but thin enough that the quantum well positions are not excessively far from the antinode of the electric field. The thickness of the barrier layers at the boundaries of the quantum well regions have some flexibility. Optimally the barrier layers need to be at least thick enough such that the energy levels of each of the quantum wells are nominally the same. The barrier layers can be thicker as may be required by material quality issues. The confining layers are often one and the same with the spacers or, as is shown in the present invention, can grade stepwise or continuously in the valence and conduction bands toward that of the barriers. Sometimes the confining layers and barrier layers are fabricated from the same compositions, but this is not optimal for carrier confinement and is usually a compromise made for processing reasons.

The thickness of the quantum well is related by quantum mechanics to the well and barrier compositions, the desired emission wavelength, and the density of states. With a higher density of states, narrower quantum wells can be optimally used.

Long wavelength quantum wells are a challenge to construct. The present invention describes enhanced quantum well performance utilizing atomic hydrogen as a surfactant during molecular beam epitaxy (MBE) growth of quantum wells used in semiconductor lasing devices such as VCSELs. The VCSEL art needs a means to achieve long wavelength quantum wells normally fabricated on GaAs substrates. The present inventor has recognized that it would be advantageous to remedy the foregoing and other deficiencies in conventional devices and to facilitate the production of longer wavelength VCSELs.

SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole. Additional objects and advantages of the current invention will become apparent to one of ordinary skill in the art upon reading the specification.

In accordance with addressing the limitations of conventional devices, presented are new and improved features of molecular beam epitaxy (MBE) applied to the growth of semiconductor material that is capable of providing longer wavelength lasing devices.

It is a feature of the present invention to provide a method of fabricating improved VCSELs using atomic hydrogen.

In accordance with the present invention, quantum wells are grown using MBE. During the growth of the strained quantum wells, an atomic hydrogen beam from either a thermal or plasma source is impinged on the growing surface. The quantum wells grown utilizing this technique are much thicker than are typically allowed by the Mathews Blakely critical thickness. This technique can be utilized also for the incorporation of nitrogen because it allows the growth of excellent quality material at lower temperatures. The use of lower temperatures prevents the phase separation of nitrogen compounds, making much higher nitrogen concentrations reasonable with good material quality.

In accordance with the present invention, quantum wells and/or associated barrier layers are grown using atomic hydrogen during MBE growth, including several novel combinations of nitrogen, aluminum, antimony, phosphorous and/or indium placed within or about a typical GaAs substrate to achieve long wavelength VCSEL performance, e.g., within the 1260 to 1650 nm range useful for fiberoptic communication.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

Fabrication of long wavelength quantum wells on GaAs substrates has proven to be very difficult, but the present invention allows for longer wavelength quantum wells and higher efficiency VCSELs to be feasible. One issue experienced in fabricating VCSELs is that long wavelength compounds tend not to be lattice matched to GaAs. This has been alleviated by utilizing nitrogen in the quantum wells, which reduces the energy band and also reduces the lattice constant in contrast to every other band gap reducing element, thereby permitting the inclusion of other elements (e.g., In, Sb), and which reduces the band gap but increases the lattice constant. Unfortunately, the use of nitrogen can have a negative effect of reducing confinement in the valence band and may tend to result in poorer luminescence material as more nitrogen is added.

Figure 1:
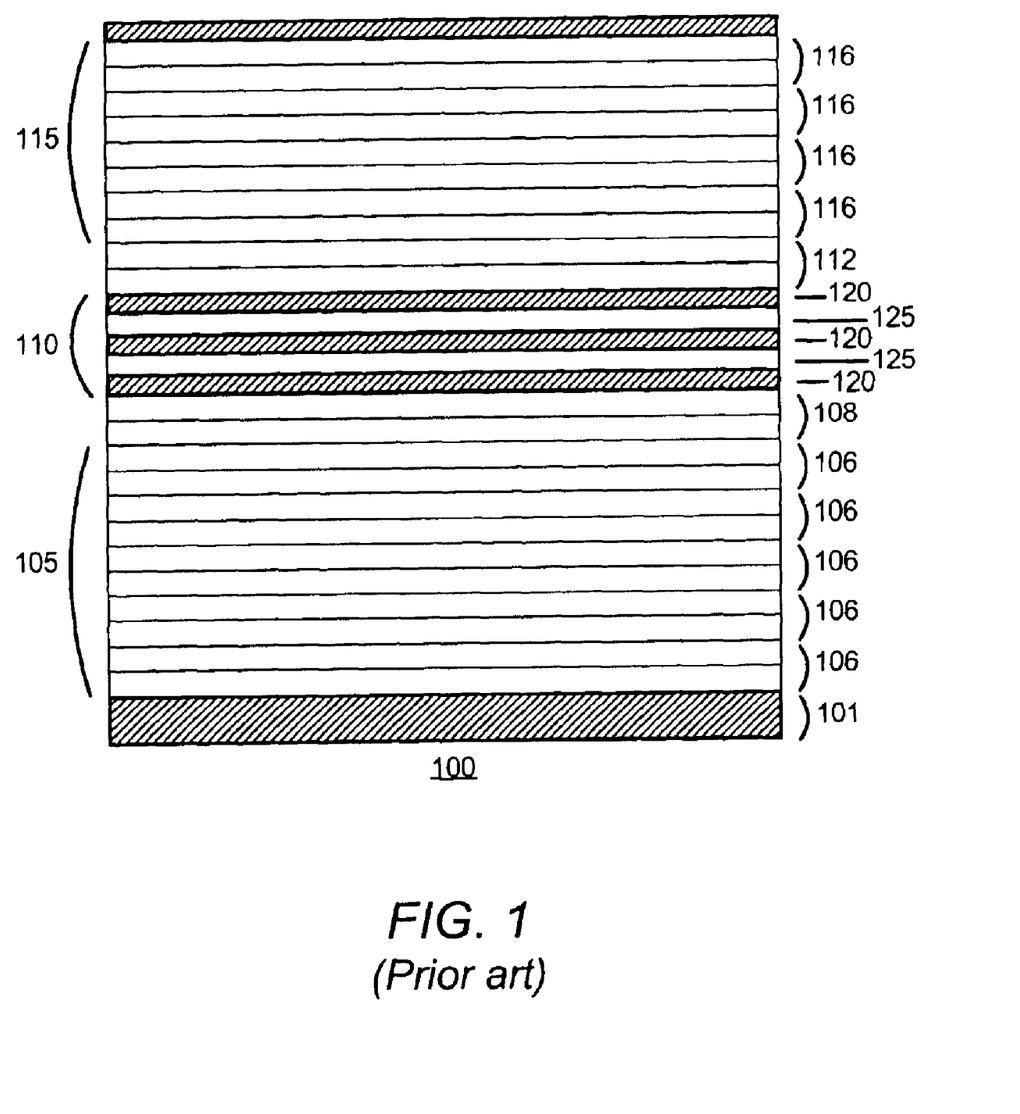
FIG. 1 is an exemplary sectional view of a VCSEL in accordance with an embodiment of the present invention.

Referring to FIG. 1, a sectional view of a vertical cavity surface emitting laser 100 (VCSEL) is illustrated. The VCSEL 100 can be grown by techniques such as molecular beam epitaxy (MBE), or metal-organic chemical vapor deposition or related techniques. Reference is made to U.S. Pat. No. 5,903,588, assigned to the assignee of the present invention, which describes methods of VCSEL fabrication use in the art and is incorporated by reference. The VCSEL can preferably be grown on a GaAs substrate 101 due to the robust nature and low cost of the material; however, it should be recognized that semiconductor materials, Ge, for example, could also be used as the substrate. The VCSEL 100 can then be formed by disposing layers on the substrate 101.

Epitaxial layers can include: a first mirror stack 105 disposed on the substrate 101, a first cladding region 108 disposed on the first mirror stack 105, an active region 110 disposed on the first cladding region 108, a second cladding region 112 disposed on the active region 110, and a second mirror stack 115 disposed on the second cladding region 112. The active region 110 can further include one or more quantum wells 120 separated from each other by barrier layers 125, depending on the application for which the VCSEL 100 is designed. One of ordinary skill in the art should appreciate from the present teaching that the number of quantum wells 120 in the VCSEL active region 110 can vary.

The first mirror stack 105 can be grown by epitaxially depositing mirror pair layers 106 on the substrate 101. In order to crystal lattice match first mirror stack 105 to the substrate 101, a suitable semiconductor material system for the mirror pair layers 106 should be deposited. In this specific example, which should not be interpreted as a limitation of the scope of the present invention, the substrate 101 is GaAs; therefore, a GaAs/AlGaAs material system can be employed. To achieve a high percentage of reflectivity, the number of mirror pair layers 106 in the first mirror stack 105 can usually range from about 20 to 40, depending on the difference between the refractive indices of the layers. Different refractive indexes are also achievable by altering the aluminum content in the first mirror stack 105.

A first cladding region 108 can be constructed from one or more layers epitaxially disposed on the first mirror stack 105. The first cladding region 108 in one embodiment of the invention can be fabricated of a GaAsN material system.

Nitrogen added to the quantum well 120 reduces the compressive strain of the quantum well 120. The reduction in compressive strain reduces the energy band gap in the quantum well 120, but even more important, the change in composition reduces it further. Band gap energy reduction increases the wavelength of the emitted photon, which can be desirable to achieve longer wavelength VCSELs 100. The more nitrogen that is added to the quantum well 120, the greater the reduction in band gap energy can be; and, thus, longer wavelength VCSELs 100 can be produced.

By utilizing nitrogen in the GaAsN barrier layers and secondarily in the quantum wells 120 themselves, the strain in the structure can be reduced, which can increase the thickness of the quantum wells 120, and the energy gap can be reduced, both of which can increase the wavelength.

The use of nitrogen in the quantum wells can make the valence band discontinuity nonconfining or type 11. By using AlGaAs or AlGaAsN as the confining material, however, and GaAsN, AlGaAs, or AlGaAsN or GaAsP barrier layers, the nonconfining problem can also be reduced. In addition, if Sb replaces a portion of the As (Arsenic) in the quantum well 120, the type II transition caused by nitrogen can further be avoided, allowing even more nitrogen. Because even more nitrogen is allowable, more indium is allowable. Because nitrogen, indium, and Sb all reduce the band gap energy, the achievable wavelengths extend to wavelengths longer than either the 1310 nm wavelength utilized for data communication or the 1550 nm wavelength used for telecommunication applications.

By adding nitrogen to the InGaAs quantum wells, the overall strain in the quantum well 120 can become significantly less, allowing more indium to be included prior to obtaining the critical thickness, thus making longer wavelength VCSELs possible. Utilizing nitrogen for strain compensation in the barriers, the allowable strain in the quantum well region can increase, meaning that even more indium can be utilized in the quantum wells. More indium is allowable without violating the critical thickness, making for an even lower band gap and longer wavelengths. In addition, utilizing nitrogen in the barrier layers between the quantum wells can also reduce the energy of these barriers in the conduction band, making the energy of the quantum state lower, further increasing the allowable wavelength. Utilizing nitrogen in the barrier layers can also be advantageous in avoiding type II behavior in the valence band; because as nitrogen is incorporated in the quantum wells, the conduction band discontinuity increases, and the valence band discontinuity decreases. In addition, use of AlGaAs or AlGaAsN for the confining structure can further avoid unintentional wells in the valence band at the barrier layer confining layer boundary. Finally, the use of Sb in the quantum well can reduce the band gap energy further, while avoiding the type II behavior (allowing even more nitrogen). All of these aspects contribute to the ability to create very long wavelength active regions.

Introducing nitrogen into the active region 110 is not generally without drawbacks. GaN and InN can have large differences in their lattice constants versus GaAs substrates. Due to this lattice mismatch, the quality of the material can be greatly compromised when layers comprising the active region 110 are grown beyond a certain critical thickness. Layers thicker than this critical thickness can possess misfit dislocations, relaxing the strain between the layers, and decreasing the material quality. This can substantially compromise the quality of the VCSEL 100.

By including nitrogen in the barrier layers 125, the band gap energy decrease can be observed as it is when nitrogen is added only to the quantum well 120. However, the amount of nitrogen needed in the quantum well 120 to achieve a given band gap energy reduction, and therefore a longer wavelength, can be reduced. The lattice mismatch can, therefore, not generally be as severe as when nitrogen is added to the quantum well 120 alone, thus making the material system easier to fabricate. Higher quality VCSELs can be achieved by introducing nitrogen into the barrier regions 125 than when only nitrogen is added to the quantum well 120.

Active region 110 can next be epitaxially deposited on the first cladding region 108. The active region 110 can include one or more quantum wells 120. The preferred embodiment uses quantum wells 120 of less than about 50 angstroms. When nitrogen is introduced into the active region 110 or the cladding region 108, 112, the effective electron mass in the regions can increase dramatically. With this increased effective mass there is a large increase in density of the states, the thickness of quantum well 120 needed to produce a given amount of gain in the active region 110 generally decreases. Therefore, the volume of the quantum well 120 can also be decreased, giving less volume in which parasitics can occur.

A second cladding region 112 can be constructed from one or more layers epitaxially disposed on the active region 110. The second cladding region 112 can be made of a GaAsN material system.

Next, a second mirror stack 115 can be grown by epitaxially depositing mirror pairs layers 116 on the second cladding region 112. In order to crystal lattice match mirror stack 115 to the substrate 101, a suitable semiconductor material system for the mirrored pairs 116 should be deposited. The substrate 101 is generally formed from GaAs; therefore, a GaAs/AlGaAs material system can be employed. To achieve a high percentage of reflectivity, the number of mirror pair layers 116 in the stack 115 can usually range from about 20 to 40, depending on the difference between the refractive indices of the layers. Different refractive indexes are achievable by altering the aluminum content in the mirror stack 115.

Figure 2:
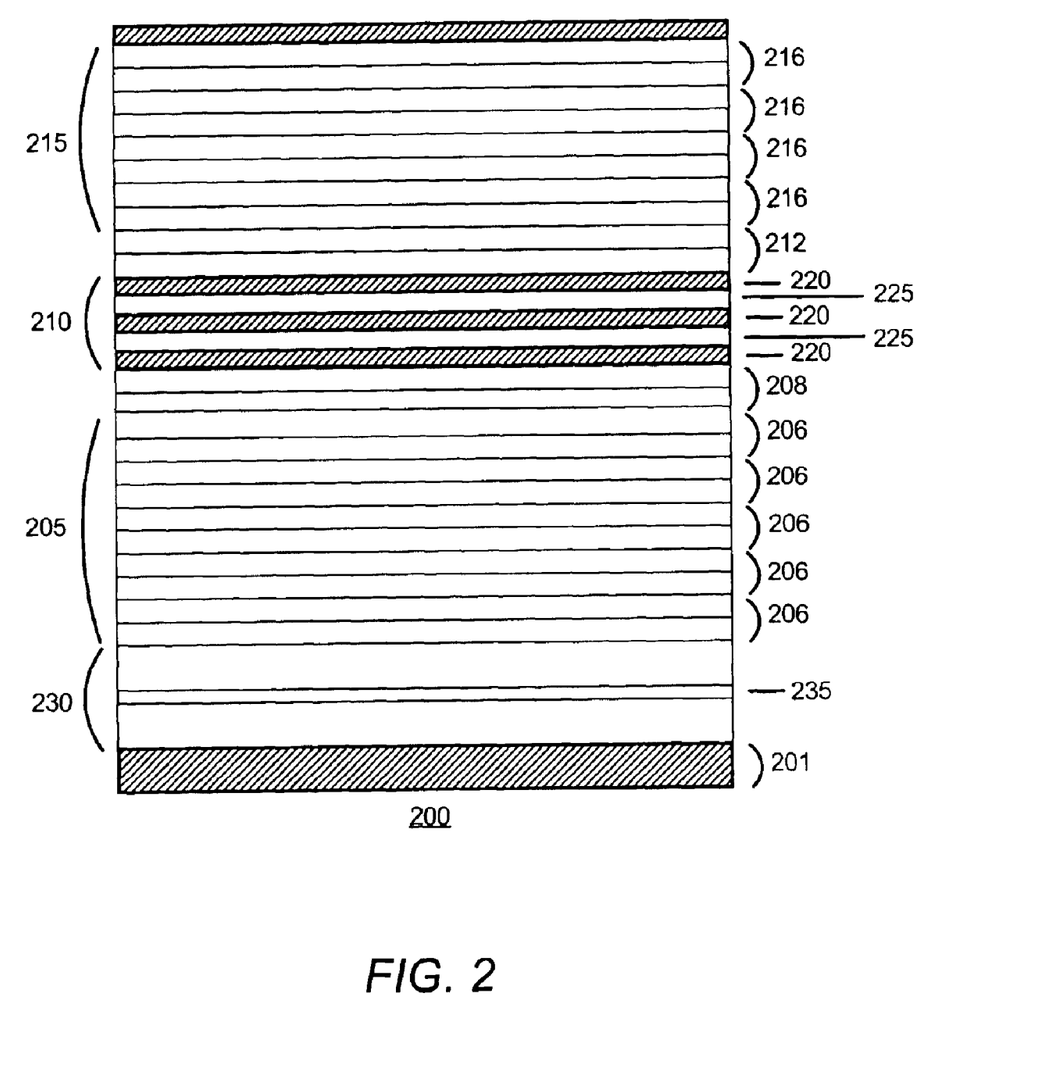
FIG. 2 is another exemplary sectional view of a VCSEL in accordance with another embodiment of the present invention.

Referring now to FIG. 2, an alternate embodiment of the present invention is illustrated. A flattening layer 235 can be grown between the first cladding region 208, which is grown on the first mirror stack 205, and quantum well(s) 220 associated with the active region 210. When the various layers are grown on the substrate 201, bunching of molecular steps form on the surface of the newly-formed layers. The steps on the layer's surface increase the likelihood that layers adjacent to the substrate 201 can dislocate from the substrate 201. A heavily compressively strained InGaAs flattening layer 235 grown as part of the active region 210 at a thickness sufficient to minimize the straining effects on the quantum well layers (e.g., about 30 angstroms) generally has the effect of flattening the surface to which the active region 210 is disposed. The flattening layer 235 can be separated from the quantum well(s) 220 by about 200 angstroms of GaAs. Growing this flattening layer 235 between the first cladding region 208 and quantum wells 225 within the active region 210 can flatten out these molecular steps. The surface can be further flattened when the epitaxial layers are grown on "100 or 111 on" orientation substrates. If the substrate is in "off" orientation, the number of molecular steps can increase and the likelihood of bunching of steps increases, thereby increasing the likelihood for dislocation. By flattening the surface upon which stacks are deposited, the strain between layers can be further increased through the addition of greater amounts of In or Sb in the active region. This increased In or Sb generally decreases the band gap energy, thereby making it easier to grow VCSELs 200 that emit longer wavelengths.

The present invention can utilize atomic hydrogen during molecular beam epitaxy (MBE) growth of active semiconductor layers for a VCSEL. This invention can also utilize strain compensation with or without nitrogen in the barrier layers to allow more In and/or Sb incorporation in the quantum wells without relaxation and thus achieve longer wavelengths. A trade off of the effects on well depth of the Sb and N can also be accomplished so that conduction band wells of at least 0.08 eV and valence band wells of at least 0.04 eV are achievable.

One reason for utilizing hydrogen as a surfactant with long wavelength lasers is to promote growth of flat layers. Flat layers (without island growth) do not have a seed for the formation of misfit dislocations. Island growth, which is problematic with highly strained layers, provides large steps that act as sources for misfit dislocations. Use of hydrogen during MBE flattens the surfaces and prevents misfit dislocation, allowing growth beyond the normal critical thickness.

Figure 3:
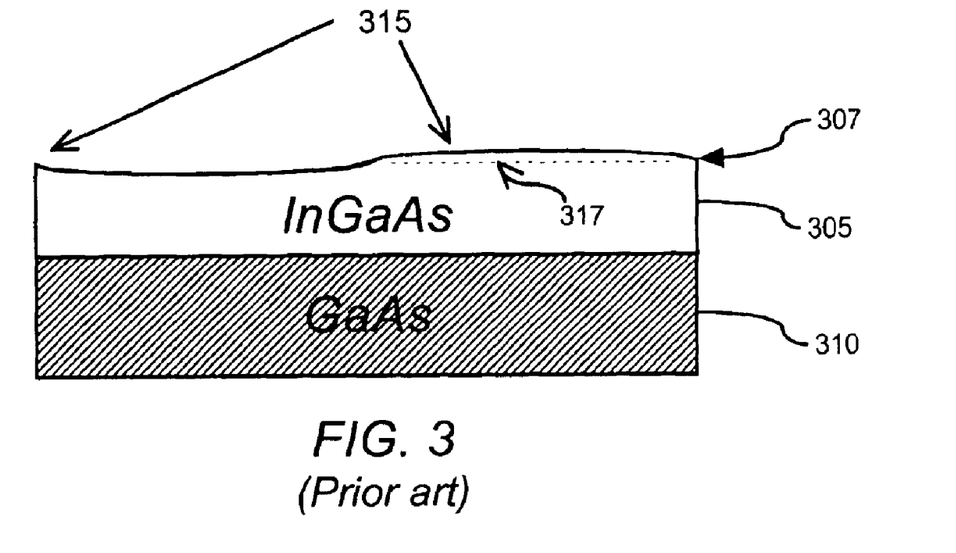
FIG. 3 is a block diagram illustrating the growth of an active semiconductor layer of a VCSEL using molecular beam epitaxy techniques.
Figure 4:
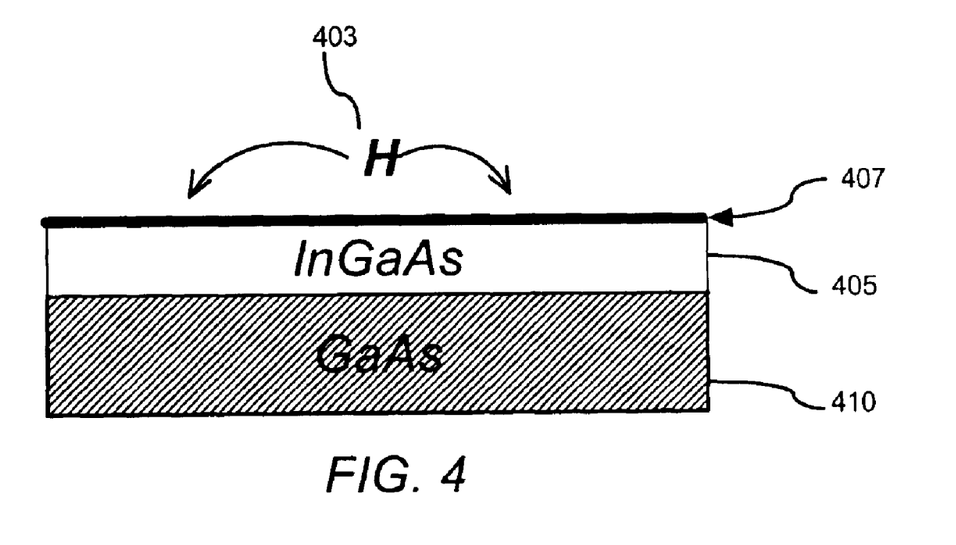
FIG. 4 is a block diagram illustrating the growth of an active semiconductor layer of a VCSEL using molecular beam epitaxy techniques employing hydrogen as a surfactant.

Referring to FIG. 3, a block diagram is shown illustrating an example of the resulting growth of an InGaAs layer 305 using MBE without the benefit of hydrogen. The InGaAs layer 305 is shown grown on a GaAs substrate 310. As can be seen in FIG. 3, islands 315 tend to form on the surface 307 of the InGaAs 305 layer. The islands 315 can be sources of misfit dislocations 317. Increased horizontal displacement caused by a multiple atomic layer step can actually cause the formation of edge dislocations caused by the misfit of the lattices. Without a multistep stackup, dislocation probably would not occur. Hydrogen, however, reduces step heights and thus reduces the formation of dislocations. Referring to FIG. 4, a block diagram is shown illustrating an example of the resulting growth of an InGaAs layer 405 using molecular beam epitaxy and the use of atomic hydrogen 403 as a surfactant. The InGaAs layer 405 is grown on a GaAs substrate 410. As can be seen in FIG. 4, a more uniform (uniformly smooth) surface 407 on the InGaAs layer 405 can be grown where hydrogen 403 is used as a surfactant in the MBE process. Misfit dislocations on the VCSEL active layers are preventable using hydrogen during the MBE process, resulting in active semiconductor layers with superior performance that result in providing longer wavelength lasing devices.

As illustrated in the example of FIG. 3, islands of InGaAs 315 begin to form during growth, causing misfit dislocations. But when atomic hydrogen is used on the growth surface, the layers do not form significant steps, causing growth of flatter layers. Atomic hydrogen treatment during alloy layer growth, therefore, results in flatter, more uniform active layers within VCSELs than has been possible prior to processing VCSEL devices without hydrogen. As a result, long wavelength VCSEL performance is made more easily possible on GaAs.

Hydrogen on the surface of the wafer during growth promotes flat growth. Hydrogen is generally provided utilizing a source similar to that known in the art for delivery of influential elements during MBE processing. For example, during the growth process, atomic hydrogen can be beamed using a plasma source or a thermal cracker, or chemically by cracking hydrogen-containing compounds, such as arsine, so that the hydrogen sits on the surface of the epitaxial layers. During the growth of at least the highly strained layers, keeping the layers flat during the growth process and allowing the layers to be grown thicker than the normal critical thickness results in the ability to grow longer wavelength active regions on GaAs. In addition, the use of nitrogen has proven problematic because of its tendency to segregate and the tendency to form three-dimensional structures. By using hydrogen, flatter, better-quality layers can be formed at the lower temperatures, which can prevent segregation.

Figure 5:
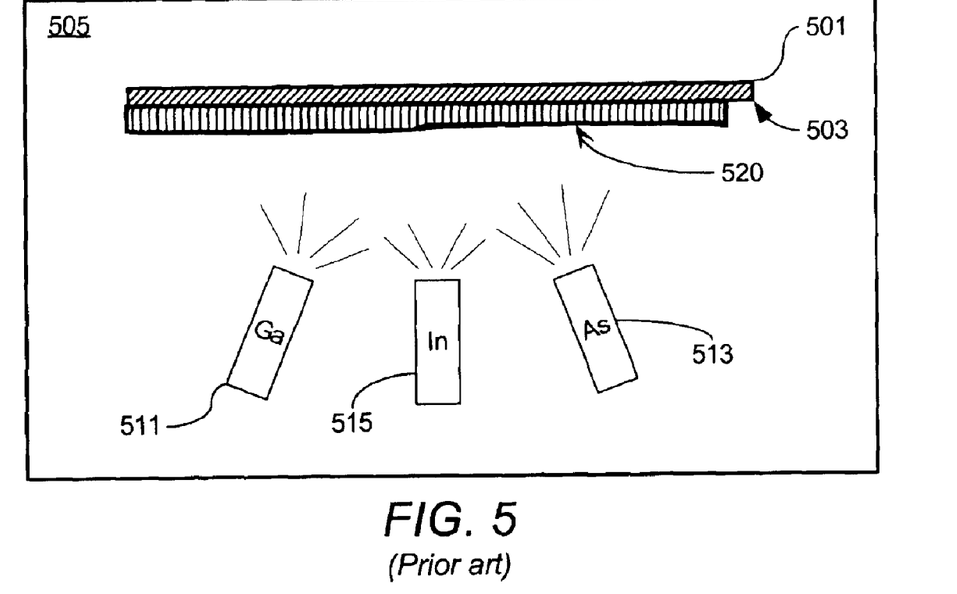
FIG. 5 is a block diagram of components used in the growth of active layer of a VCSEL using molecular beam epitaxy techniques.

Referring to FIG. 5, a block diagram is shown illustrating some components that are used in a system for the growth of active layers of VCSELs using molecular beam epitaxy. During semiconductor processing, a wafer 501 is placed within a controlled environment 505, wherein the wafer 501 is generally heated to about 450° C. Cells 511–515 are then used for producing various beams of selected elements, which are further oriented within the environment to promote growth on the substrate surface 503 of the wafer 501. Beam sources from the cells can be, for example, Ga 511, As 513, and In 515 effusion cells. It is well known in the art, however, that Al, Sb, and/or N can also be sources used to impinge on the wafer surface during, and to promote, growth of certain semiconductor materials.

Figure 6:
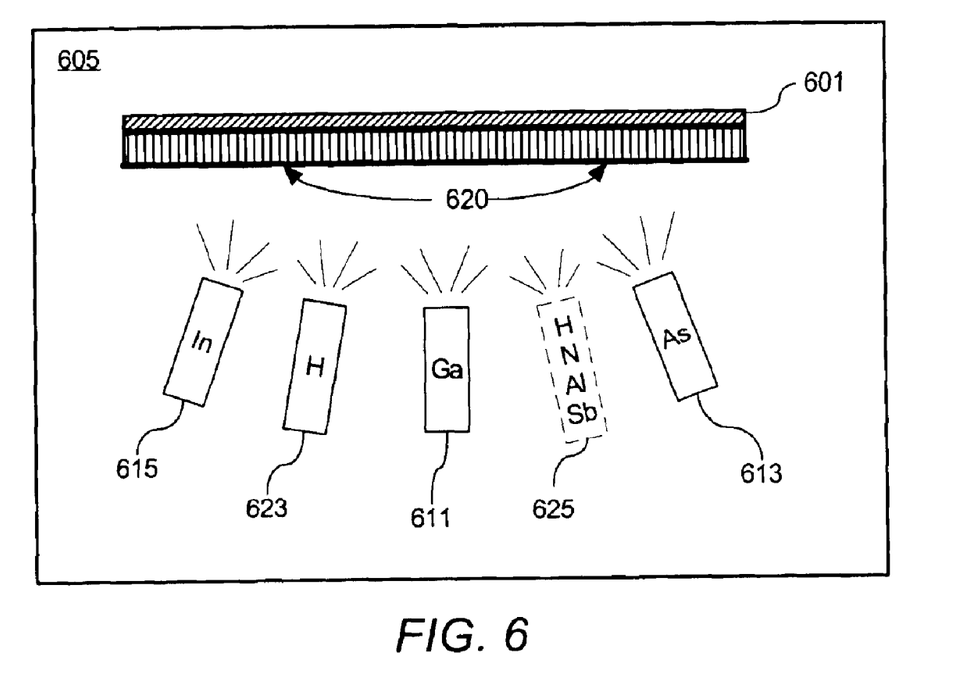
FIG. 6 is a block diagram of components used in the growth of active layers of a VCSEL using molecular beam epitaxy techniques in accordance with the present invention.

Atomic hydrogen can be obtained from plasma sources or thermal cracker or from cracking of hydrogen-containing compounds, such as arsine or N—H radicals. As discussed in FIG. 4, hydrogen can substantially improve growth quality during MBE processing. Referring to FIG. 6, a wafer 601 within the controlled environment 605 cell can be beamed with typical sources, such as In 615, Ga 611 and As 613. In addition, cells can provide atomic hydrogen 623 during processing to provide control and promote growth quality. Also as shown in FIG. 6, a combined source 625 of, for example, nitrogen/hydrogen can generate desired sources and can be provided together with controlled environments 605 as cells for purposes of carrying out the invention.

The embodiment and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. Method of processing a vertical cavity surface emitting laser using molecular beam epitaxy (MBE), comprising:
   placing a GaAs wafer into a controlled environment;
   promoting growth of strained semiconductor layers in at least one quantum well associated with a VCSEL by providing sources of at least In, Ga, and As in order to form a growing surface comprising said at least In, Ga, and As; and
   providing atomic hydrogen on said growing surface as a surfactant in order to yield a flatter surface.

2. The method of claim 1, wherein said controlled environment includes a temperature up to 450° C.

3. The method of claim 1, further Comprising providing as source of nitrogen.

4. The method of claim 1, further comprising providing a source of aluminum.

5. The method of claim 1, further comprising providing a source of antinomy.

6. The method of claim 1, further comprising providing a source of nitrogen and a source of antinomy.

7. The method of claim 1, further comprising providing a source of nitrogen and aluminum.

8. The method of claim 1, said atomic hydrogen surfactant preventing island growth on said growing surface.

9. The method of claim 8, said atomic hydrogen surfactant preventing formation of significant steps en said growing surface.

10. The method of claim 1, further comprising providing nitrogen in order for said growing surface to include nitrogen in addition to said at least In, Ga, and As.

11. The method of claim 10, said nitrogen and atomic hydrogen surfactant being provided by a combined source.

12. Method of processing a vertical cavity surface emitting laser using molecular beam epitaxy (MBE), comprising:
   placing a GaAs wafer into a controller environment;
   promoting growth of strained semiconductor layers in at least one quantum well associated with a VCSEL by providing sources of; In, Ga, As; and nitrogen in order to form a growing surface comprising said In, Ga, As, and nitrogen;

beaming atomic hydrogen so as to impinge said growing surface as a surfactant in order to yield a flatter surface.

13. The method of claim 12, wherein said controlled environment includes a temperature up to 450° C.

14. The method of claim 12, said atomic hydrogen surfactant preventing island growth on said growing surface.

15. The method of claim 14, said atomic hydrogen surfactant preventing formation of significant steps on said growing surface.

16. Method of processing a vertical cavity surface emitting laser using molecular beam epitaxy (MBE), comprising:

placing a GaAs wafer into a controlled environment;

promoting growth of strained semiconductor layers in at least one quantum well associates with a semiconductor laser by providing sources of at least one of In, As and nitrogen in order to form a growing surface comprising said at least one of In, As, and nitrogen; and providing atomic hydrogen as a surfactant on said growing surface as a surfacant in order to yield a flatter surface.

17. The method of claim 16, said atomic hydrogen surfactant preventing island growth on said growing surface.

18. The method of claim 16, said nitrogen and atomic hydrogen surfactant being provided by a combined source.

19. Method of processing a vertical cavity surface emitting laser using molecular beam epitaxy (MBE), comprising:

placing a wafer comprising Ga into a controlled environment;

promoting growth of strained semiconductor layers in at least one quantum wells associated with a VCSEL by providing sources of at least In, Ga, and As in order to form a growing surface comprising said at least In, Ga, and As; and providing atomic hydrogen on said growing surface as a surfactant in order to yield a flatter surface.

20. The method of claim 19, said atomic hydrogen surfacant preventing island growth on said growing surface.

* * * * *

UNITED STATES PATENT AND TRADEMARK OFFICE
CERTIFICATE OF CORRECTION

PATENT NO. : 6,858,519 B2  Page 1 of 1
APPLICATION NO. : 10/219425
DATED : February 22, 2005
INVENTOR(S) : Johnson It is certified that error appears in the above-identified patent and that said Letters Patent is hereby corrected as shown below:

Cover Page
Item 56, References Cited, US. PATENT DOCUMENTS, Pat. No. 6,489,175 change "Lee et al." to -- Jiang, et al.--

Column 3
Line 32, before "active layer." insert --an--

Column 4
Line 61, change "11" to --II--

Column 7
Line 66, before "thermal cracker" insert --from a--

Column 8
Line 44, before "source" change "an" to --a--

Column 9
Line 1, change "sources of;" to --sources of:--
Line 1, change "As;" to --As,--
Line 17, change "associates" to --associated--

Column 10
Line 9, change "Ga" to --Ge--

Signed and Sealed this

Twelfth Day of December, 2006

JON W. DUDAS
*Director of the United States Patent and Trademark Office*